United States Patent
Nguyen et al.

(10) Patent No.: US 7,317,623 B2
(45) Date of Patent: Jan. 8, 2008

(54) SWAPPABLE MOUNT FOR CABLE SUPPORT AND SYSTEM AND METHOD INCORPORATING SAME

(75) Inventors: Minh H. Nguyen, Katy, TX (US); Alan B. Doerr, Magnolia, TX (US); Stephen N. Bushong, The Woodlands, TX (US); Robert Hastings, Spring, TX (US); Jelle M. Schuur, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 478 days.

(21) Appl. No.: 10/324,945

(22) Filed: Dec. 20, 2002

(65) Prior Publication Data

US 2004/0120134 A1    Jun. 24, 2004

(51) Int. Cl.
*H02B 1/20* (2006.01)

(52) U.S. Cl. .................................................. 361/826

(58) Field of Classification Search ........ 361/825–829, 361/428, 383, 683, 725–728; 312/22.2, 265.1–265.2, 312/294, 223.1; 211/26, 183, 189, 190, 96; 248/282.1, 283.1
See application file for complete search history.

(56) References Cited

U.S. PATENT DOCUMENTS

| 6,021,909 | A  | * | 2/2000  | Tang et al. ................. 211/183 |
| 6,070,742 | A  | * | 6/2000  | McAnally et al. ............ 211/26 |
| 6,269,959 | B1 | * | 8/2001  | Haworth ...................... 211/26 |
| 6,305,556 | B1 | * | 10/2001 | Mayer ......................... 211/26 |
| 6,327,139 | B1 | * | 12/2001 | Champion et al. .......... 361/608 |
| 6,435,354 | B1 | * | 8/2002  | Gray et al. ................... 211/26 |
| 6,442,030 | B1 | * | 8/2002  | Mammoser et al. ........ 361/727 |
| 6,523,918 | B1 | * | 2/2003  | Baiza ...................... 312/265.1 |
| 6,578,939 | B1 | * | 6/2003  | Mayer ..................... 312/334.5 |

* cited by examiner

*Primary Examiner*—P. Austin Bradley
*Assistant Examiner*—Thanh S. Phan

(57) ABSTRACT

A swappable mount and cable support arm for a rack mount system. The swappable mount may have a variety of toolfree mounts, threaded fasteners, latches, and other mounting mechanisms. The swappable mount is interchangeably coupled to the cable support arm to facilitate adaptation to a particular rack mount system. One embodiment has a releasable hinge mechanism to facilitate the interchangeable coupling between the swappable mount and the cable support arm. The cable support arm may have a variety of expandable support structures, such as pivotally coupled arm sections. One embodiment of the cable support arm has first and second arm sections rotatably coupled one over the other at a hinge.

36 Claims, 6 Drawing Sheets

SWAPPABLE MOUNT FOR CABLE SUPPORT AND SYSTEM AND METHOD INCORPORATING SAME

BACKGROUND OF THE INVENTION

This section is intended to introduce the reader to various aspects of art, which may be related to various aspects of the present subject matter described and/or claimed below. The discussion is believed to be helpful in providing the reader with background information to facilitate a better understanding of the various aspects of the present subject matter. Accordingly, it should be understood that these statements are to be read in this light, and not as admissions of prior art.

Rack systems, such as rack mount server systems, have rack spaces for a variety of rack mountable devices. In operation, the rack mountable devices communicate with the rack system through cables, which are routed from each rack mountable device to the rack system. The cables consume considerable space within the rack systems, restrict movement of the rack mountable devices, limit the mounting depth of the rack mountable devices, complicate rear access to the rack mountable devices, and create various other technical constraints.

BRIEF DESCRIPTION OF THE DRAWINGS

Exemplary embodiments will hereafter be described with reference to the accompanying drawings, wherein like reference numerals denote like elements, and.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As discussed in detail below, a unique system and method is provided for supporting one or more cables or cords between a rack and a rack mounted device. However, the illustrated embodiments may be used to mount one or more cables or cords between a variety of components in a movable relationship. Moreover, a variety of movable carrier mechanisms, rotatable joint mechanisms, swappable mounts, and attachment mechanisms may be used within the scope of the illustrated embodiments.

Figure 1:
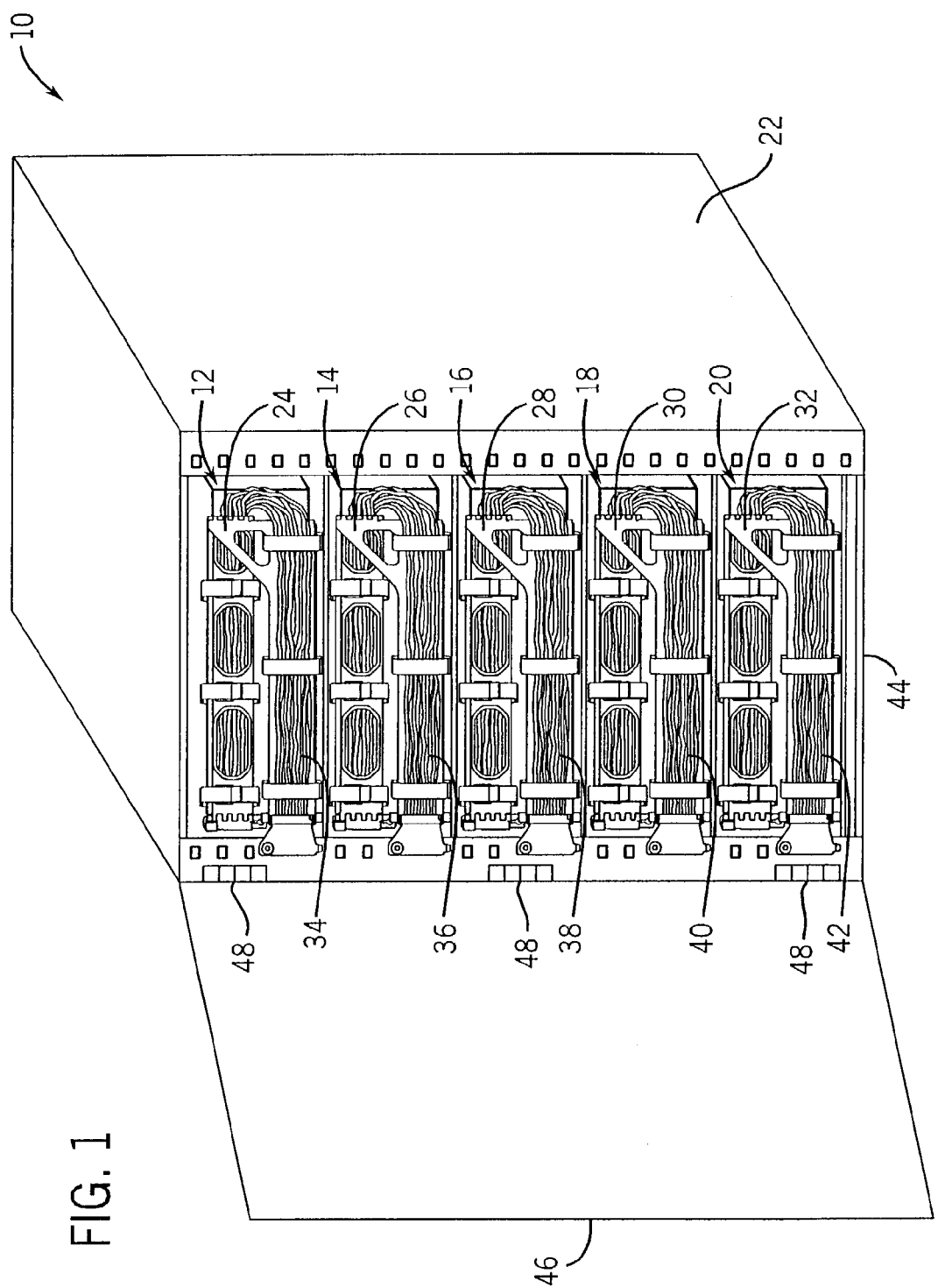
FIG. 1 is a perspective view illustrating a multilevel cable support arm coupled to a rack system according to embodiments of the invention.

FIG. 1 is a perspective view of an exemplary rack mount system 10 according to embodiments of the present technique. As illustrated, the rack mount system 10 includes a plurality of rack mounted devices, such as rack mountable devices 12, 14, 16, 18, and 20, which are disposed in a rack structure 22. For example, the rack mountable devices 12-20 may comprise a variety of computing components, such as a rack mountable server. The rack structure 22 may have any number and configuration of rack mount receptacles having supports, such as manual or automatic rail mechanisms, which support the rack mountable devices 12, 14, 16, 18, and 20 movably within the rack structure 22.

The rack mount system 10 also may have a plurality of cables extending between the rack mountable devices 12, 14, 16, 18, and 20 and the rack structure 22. Accordingly, the rack mount system 10 may comprise one or more cable support structures, such as cable support arms 24, 26, 28, 30, and 32. The cable support arms 24, 26, 28, 30, and 32 may be rotatably coupled to the rack structure 22 and to the respective rack mountable devices 12, 14, 16, 18, and 20, such that cables can be moveably supported between the rack structure 22 and the rack mountable devices 24-32. As discussed in further detail below, the cable support arms 24-32 may route cables 34, 36, 38, 40, and 42 in a generally U-shaped route around a rotational axis, which may be substantially parallel to a rear face 44 of the rack structure 22 and the respective devices 12, 14, 16, 18, and 20. The rack structure 22 also may have a rear access door 46 coupled to the rack structure 22 via one or more hinges 48.

In a closed configuration, as illustrated in FIG. 1, the cable support arms 24-32 may support the cables 34-42 in a relatively low profile configuration (e.g., stacked configuration) between the rear face 44 and the rack mountable devices 12-20 disposed within the rack structure 22. If a user desires access to the cables 34-42, then the user may open the rear access door 46. If the user desires access to rear portions (e.g., input/output connectors) of the rack mountable devices 12, 14, 16, 18, and 20, then the user may rotate the respective cable support arm 24, 26, 28, 30, and 32 outwardly from the rear face 44 to gain the desired rear access (e.g., FIG. 9). The cable support arms 24-32 also may extend inwardly from the rear face 44 into the rack structure 22 as the respective rack mountable device 12-20 is extracted from the rack structure 22 (e.g., FIG. 8). Accordingly, the cable support arms 24-32 facilitate access to rear portions of the rack mountable devices 12-20, while also reducing space consumption for supporting the cables 34-42 movably between the rack structure 22 and the rack mountable devices 12-20.

Figure 2:
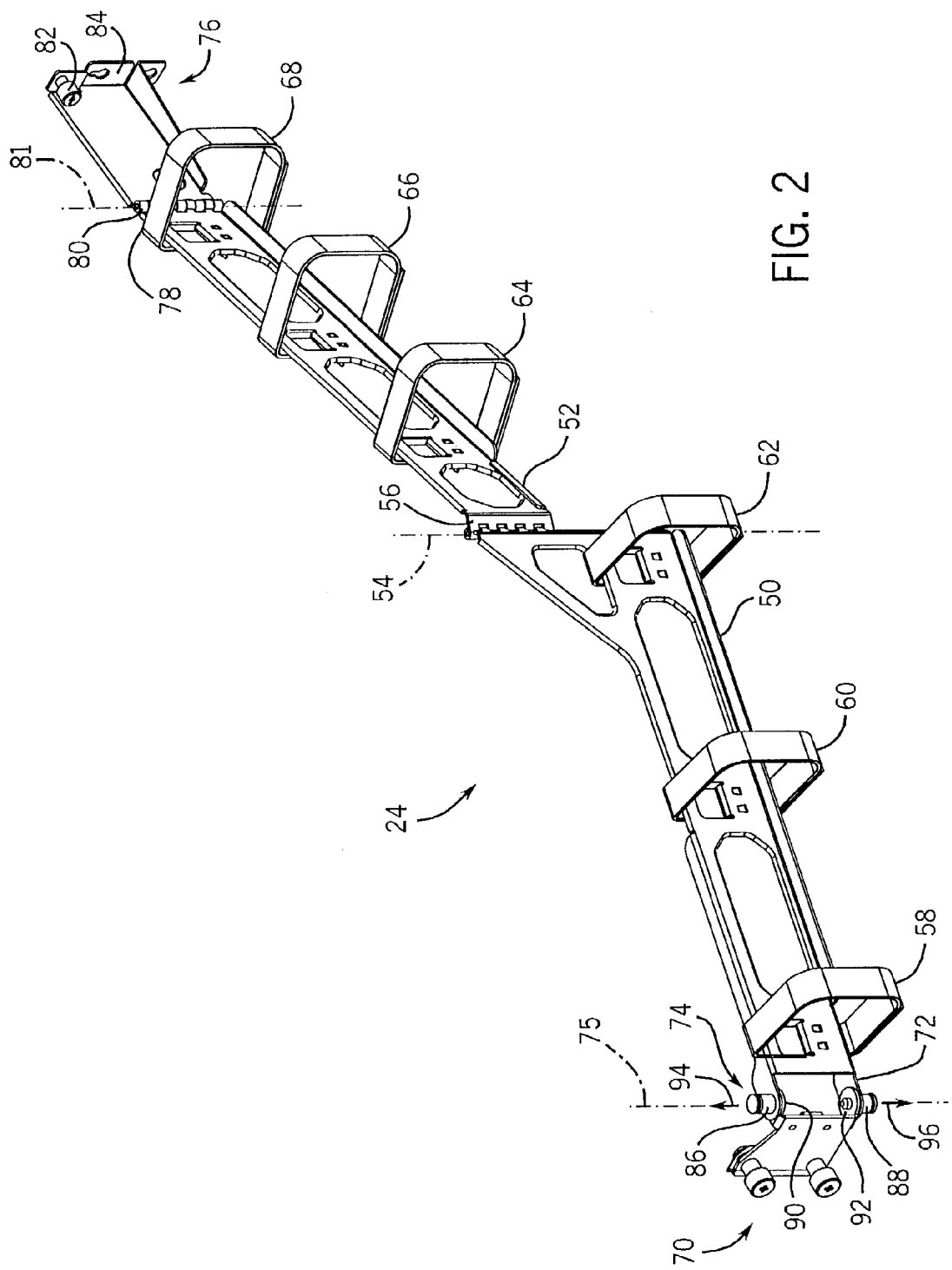
FIG. 2 is a perspective view further illustrating the multilevel cable support arm of FIG. 1 in accordance with embodiments of the invention.

An exemplary embodiment of the cable support arm 24 is illustrated in FIG. 2. As illustrated, the cable support arm 24 has arm sections 50 and 52 rotatably coupled in a stacked configuration (i.e., one over the other) along a rotational axis 54 via hinge 56. The hinge 56 may be any suitable pivotal mechanism, such as a pivot joint, a multi-joint hinge, and so forth. The cable support arm 24 also may have a cable mounting mechanism to support the desired cables along the arm section 50, along the rotational axis 54 between the arm sections 50 and 52, and along the arm section 52. For example, the cable support arm 24 may have one or more cable mounting straps, such as cable mounting straps 58, 60, 62, 64, 66, and 68. The cable mounting straps 58-68 may comprise a variety of materials and attachment mechanisms, such as plastic, metal, or cloth straps having toolfree connectors (e.g., Velcro, snap-fit, friction mechanism, elastic or compressive mechanism, etc.).

As illustrated in FIG. 2, the cable support arm 24 also may have a variety of mounting brackets to mount the arm sections 50 and 52 to the rack structure 22 and to the desired rack mountable device 12-20. For example, the cable support arm 24 may have a rack mounting bracket 70 rotatably coupled to a bracket mounting end 72 of the arm section 50 via a releasable hinge mechanism 74. Although any suitable pivotal mechanism may be used for the hinge mechanism 74, the illustrated embodiments may use the releasable hinge mechanism 74 to facilitate removal, replacement, and exchange of the rack mounting bracket 70 with any one of a variety of identical or different rack mounting brackets. Accordingly, the cable support arm 24 may be mounted to a wide variety of rack structures with different mounting mechanisms. It also should be noted that the hinge mechanism 74 extends through a rotational axis 75, which may be parallel with the rotational axis 54.

The cable support arm 24 also may have a device mounting bracket 76 rotatably coupled to a bracket mounting end 78 of the arm section 52 via a hinge mechanism 80. As with the rack mounting bracket 70, the device mounting bracket 76 may be releasably or nonreleasably coupled to the arm section 52. Accordingly, if a variety of different mounting mechanisms are expected for the rack mountable devices 12-20, then the illustrated embodiments may implement a release mechanism on the rack mounting bracket 70 to facilitate exchange with a desired mounting mechanism. Again, the hinge mechanism 80 extends through a rotational axis 81, which may be parallel with the rotational axis 54. The hinge mechanisms 74 and 80 also may be alignable along a common axis (i.e., axes 75 and 81), such that the arm sections 50 and 52 may be rotated jointly in a direction outwardly from the rack structure 22 (e.g., see FIG. 9)

The rack mounting bracket 70 and the device mounting bracket 76 may comprise a variety of mounting structures, such as a threaded fastener, a latch mechanism, a toolfree attachment mechanism, or any other suitable coupling mechanism. As illustrated, the device mounting bracket 76 has a threaded fastener 82 and a key-shaped slot 84. The illustrated rack mounting bracket 70 also may comprise a variety of mounting mechanisms, such as threaded fasteners, latch mechanisms, key-shaped slots, and so forth. If a different mounting mechanism is desired for the arm section 50, then the rack mounting bracket 70 may be exchangeable with a desired bracket of a plurality of rack mounting brackets via the releasable hinge mechanism 74. In the illustrated embodiment, the rack mounting bracket 70 can be released from the bracket mounting end 72 by moving releasable pins 86 and 88 outwardly from pin receptacles 90 and 92, as illustrated by arrows 94 and 96, respectively. The releasable pins 86 and 88 also may be spring-biased toward the pin receptacles 90 and 92. However, any other suitable release mechanism is within the scope of the illustrated embodiments.

Figure 3:
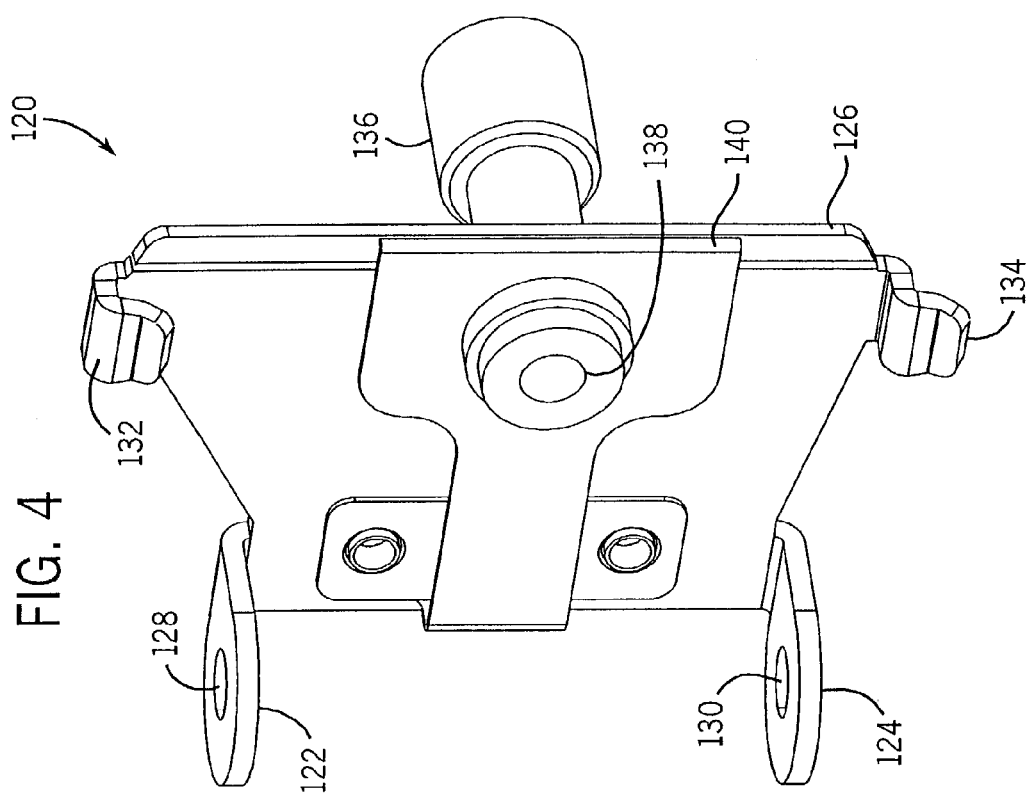
FIGS. 3 and 4 are perspective views illustrating a rack mounting bracket for the multilevel cable support arm illustrated in FIGS. 1 and 2 according to embodiments of the invention.

A detailed illustration of the rack mounting bracket 70 detached from the arm section 50 is provided in FIG. 3. As illustrated in FIG. 3, the rack mounting bracket 70 has pin brackets 98 and 100 extending from a mounting panel 102. The pin brackets 98 and 100 have receptacles 104 and 106 for receiving the releasable pins 86 and 88, respectively. Accordingly, the rack mounting bracket 70 is rotatable about the releasable pins 86 and 88 at the pin brackets 98 and 100. In the illustrated embodiment, the rack mounting bracket 70 has externally threaded fasteners 108 and 110 extending rotatably through the mounting panel 102. The externally threaded fasteners 108 and 110 also may be rotatably retained by the mounting panel 102. Opposite the mounting panel 102, the rack mounting bracket 70 has a mounting panel 112, which has internally threaded fasteners 114 and 116 retained in alignment with the externally threaded fasteners 108 and 110, respectively. Accordingly, the mounting panels 102 and 112 may be positioned about a panel of the rack structure 22, such that the fasteners 108 and 114 and fasteners 110 and 116 align with mounting holes in the rack structure 22. The externally threaded fasteners 108 and 110 may then be engaged with the respective internally threaded fasteners 114 and 116 to secure the rack mounting bracket 70 to the rack structure 22.

Figure 4:
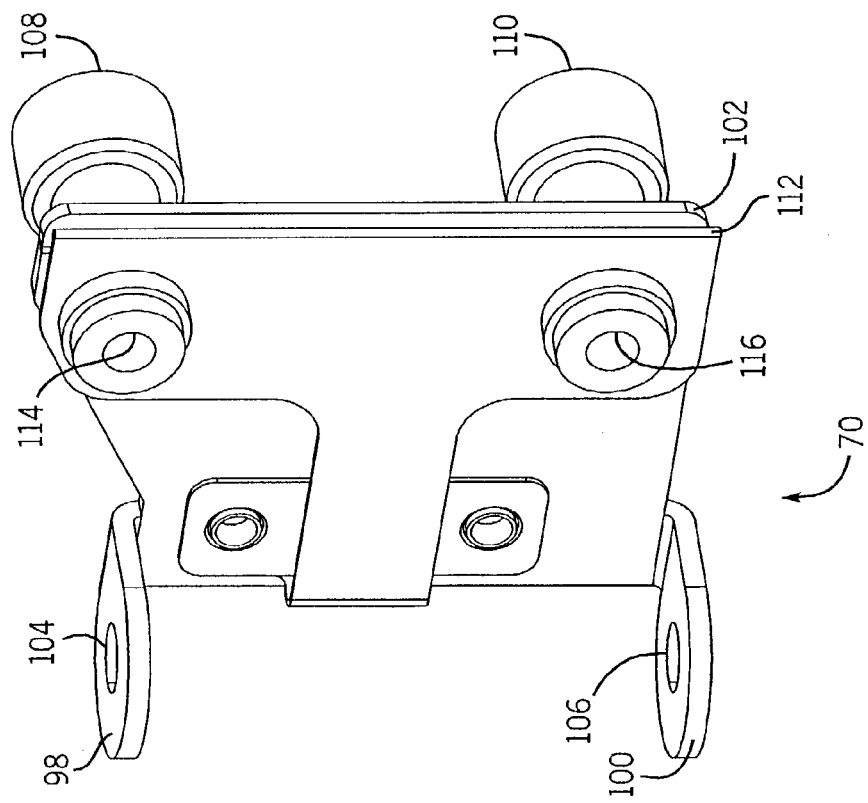

As mentioned above, the rack mounting bracket 70 may be exchanged with a variety of different types and configurations of mounting mechanisms. FIG. 4 is a perspective view of an alternative rack mounting bracket 120. In this exemplary embodiment, the rack mounting bracket 120 comprises pin brackets 122 and 124 extending from a mounting panel 126. Again, the pin brackets 122 and 124 have receptacles 128 and 130, which are engageable with the releasable pins 86 and 88. In operation, the rack mounting bracket 120 may be rotated about the releasable pins 86 and 88. The rack mounting bracket 120 also may have a variety of latch members, such as latches 132 and 134, which are engageable with mating latch receptacles in the rack structure 22. The rack mounting bracket 120 also may have a fastening mechanism to secure the mounting panel 126 to the rack structure 22 after engaging the latches 132 and 134 with the rack structure 22. In the illustrated embodiment, the rack mounting bracket 120 may have an externally threaded fastener 136 extending rotatably through the mounting panel 126. The externally threaded fastener 136 also may be rotatably retained by the mounting panel 126. Opposite the mounting panel 126, the rack mounting bracket 120 has a mounting panel 140, which has an internally threaded fastener 138 retained in alignment with the externally threaded fastener 136. In operation, the mounting panels 126 and 140 may be disposed about a panel of the rack structure 22, such that the externally threaded fastener 136 may be extended through a receptacle in the rack structure 22 into engagement with the internally threaded fastener 138. The externally and internally threaded fastener 136 and 138 may then be rotatably coupled to secure the rack mounting bracket 120 to the rack structure 22.

It should be noted that any suitable latching and fastening mechanisms can be used within the scope of the illustrated embodiments. However, each of the alternative rack mounting brackets 70 and 120 and any other desired rack mounting brackets may have certain fastening and mounting features to accommodate a particular configuration and type of rack structure, such as the rack structure 22. The foregoing rack mounting brackets 70 and 120, and a variety of other desired brackets, are exchangeably mountable to the cable support arm 24 via the releasable hinge mechanism 74. Accordingly, the cable support arm 24 may be mounted to a variety of different types of rack structures.

The cable support arm 24 is further illustrated with reference to FIGS. 5 and 6, which have another alternative rack mounting bracket 142 coupled to the arm section 50 via the releasable hinge mechanism 74. The illustrated rack mounting bracket 142 has a latch 144 and a fastener assembly 146. As discussed above, rack mounting bracket 142 may have any suitable latching and fastening mechanisms, such as toolfree connectors, threaded fasteners, and or other fasteners.

Figure 5:
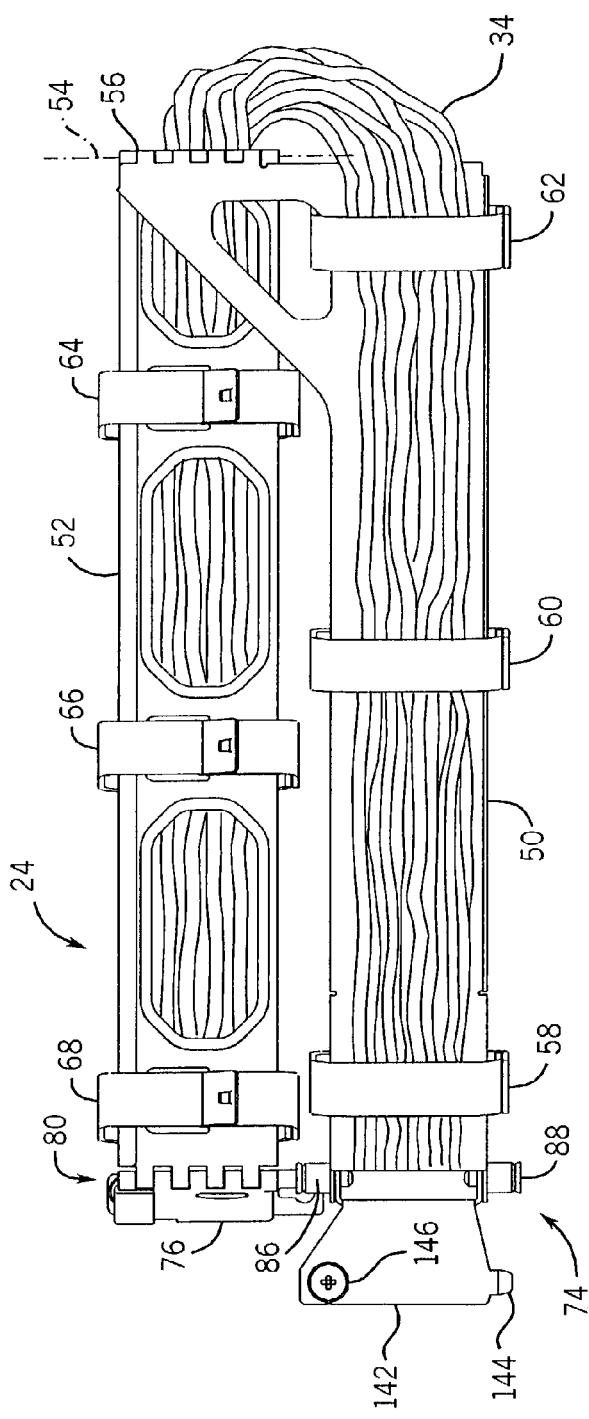
FIG. 5 is a rear view further illustrating the multilevel cable support arm of FIG. 1 in accordance with embodiments of the invention.
Figure 6:
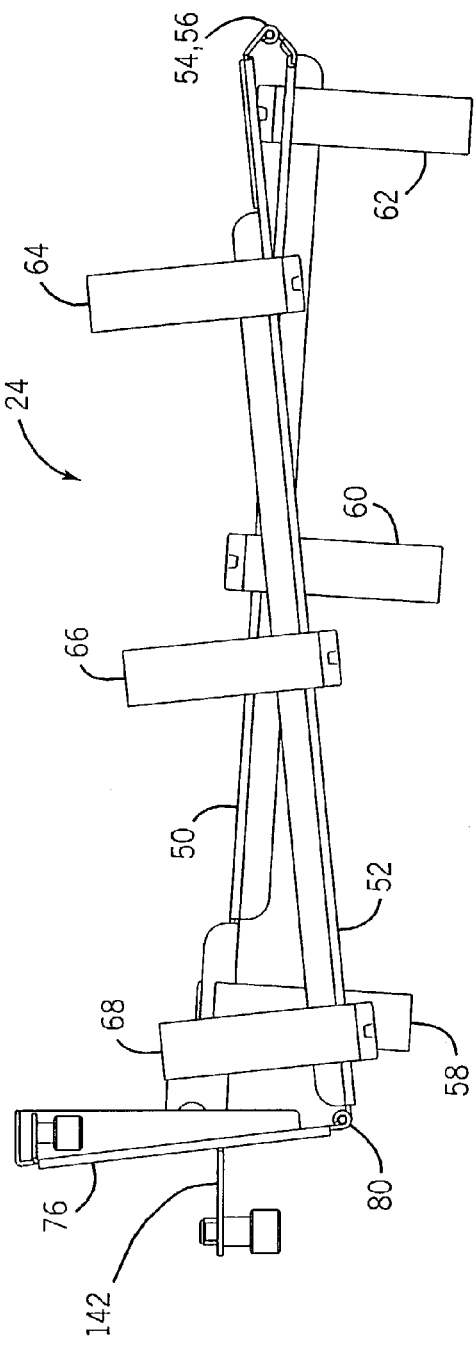
FIG. 6 is a top view further illustrating the multilevel cable support arm of FIG. 1 in accordance with embodiments of the invention.

As illustrated in the rear view of FIG. 5, the cable support arm 24 may have a generally stacked configuration of the arm section 52 over the arm section 50. In this stacked configuration, the arm sections 50 and 52 may be rotated about the hinge 56, the releasable hinge mechanism 74, and the hinge mechanism 80 with a greater degree of flexibility. For example, the arm sections 50 and 52 may be rotated inwardly and outwardly relative to a mounting plane, such as the rear face 44 of the rack structure 22. The arm sections 50 and 52 also may be rotated across one another in a forward expanding V-shaped configuration and, also, in a reverse storage V-shaped or X-shaped configuration. In operation, the arm sections 50 and 52 support one or more cables in route, which has a relatively low profile in a closed configuration of the rack mountable device within the rack structure 22. For example, the cable support arm 24 may support one or more communication cables 34 in a U-shaped cable route extending through the cable mounting straps 58-68. In this U-shaped cable route, the cable 34 extends along the arm section 50, curves along the rotational axis 54 from the arm section 50 to the arm section 52, and extends along the arm section 52 to the device mounting bracket 76. The foregoing cable route orients the one or more communication cables 34 in plane that is generally parallel (i.e., the rotational axis 54 is parallel) to the rear face 44 of the rack structure 22. In this manner, the cable support arm 24 also orients the cable 34 substantially perpendicular to the direction of movement of the rack mountable device. Accordingly, the cable support arm 24 reduces space consumption of the cables 34 to accommodate a deeper rack mountable device.

As discussed above, the cable support arm 24 may be positionable in a variety of unique expanding, contracting, and closed positions attributed to the stacked configuration of the arm sections 50 and 52. FIG. 6 is a top view of the cable support arm 24 further illustrating the flexible positioning and low profile of the cable support arm 24 and mounted cable 34. In the illustrated embodiment, the cable support arm 24 is disposed in an X-shaped configuration in which the arm sections 50 and 52 are crossed over one another. Depending on the particular configuration of the cable support arm 24, the arm sections 50 and 52 also may be capable of both forward and reverse V-shaped configurations as the cable support arm 24 expands and contracts between open and closed positions of the rack mountable device 12.

Figure 7:
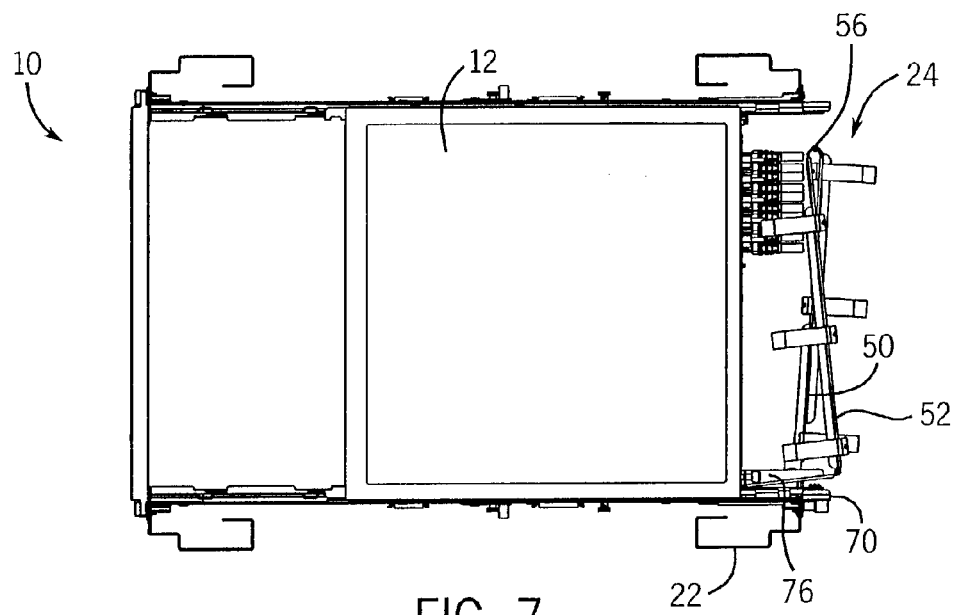
FIG. 7 is a partial top view of the rack system of FIG. 1 illustrating a multilevel cable support arm disposed in a closed configuration in accordance with embodiments of the invention.
Figure 8:
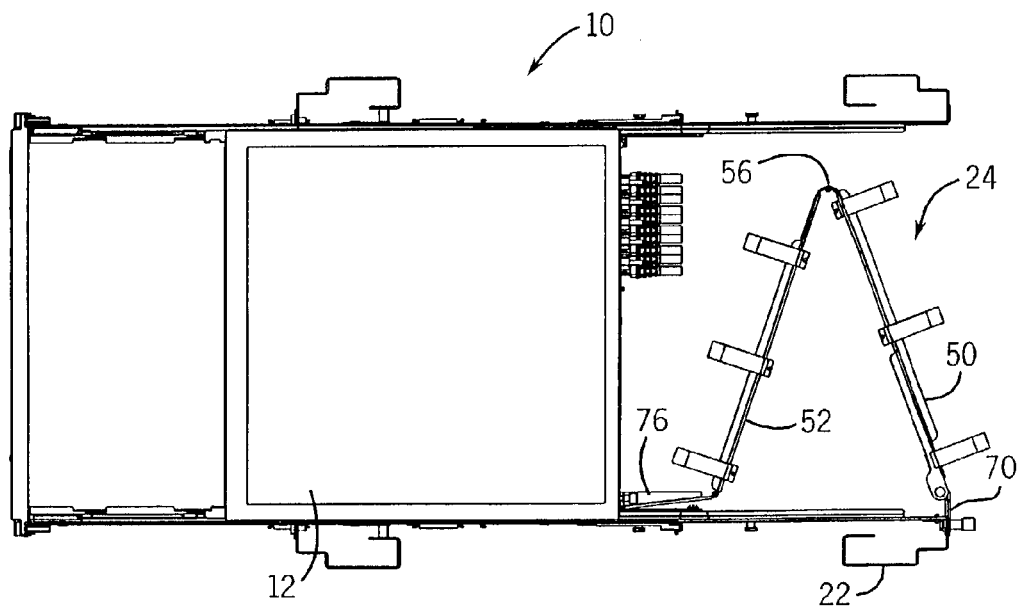
FIG. 8 is a partial top view of the rack system of FIG. 1 illustrating a multilevel cable support arm disposed in a open configuration in accordance with embodiments of the invention.
Figure 9:
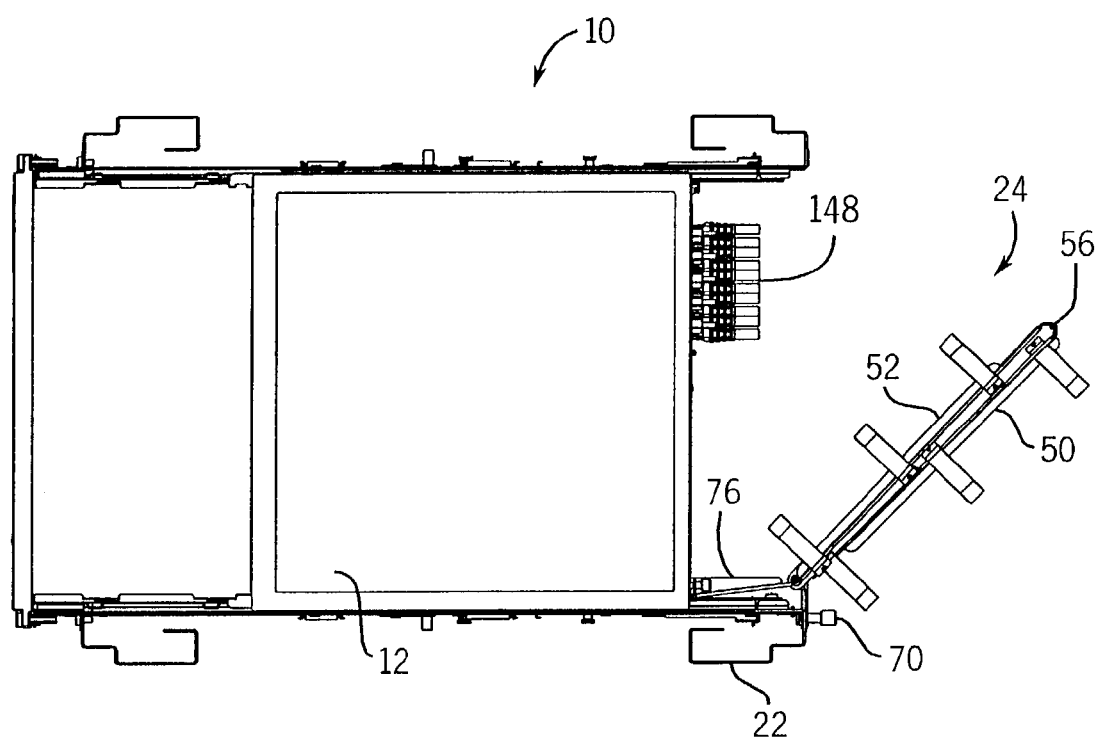
FIG. 9 is a partial top view of the rack system of FIG. 1 illustrating a multilevel cable support arm disposed in a rear access configuration in accordance with embodiments of the invention.

Several operational configurations of the illustrated embodiments are illustrated in FIGS. 7-9, which are partial top views of the rack mount system 10 illustrating the rack mountable device 12 and the associated cable support arm 24 in various positions. In the illustrated embodiment of FIG. 7, the rack mountable device 12 is fully inserted within the rack structure 22, and the cable support arm 24 is disposed in a crossed or X-shaped configuration. In this closed configuration, the cable support arm 24 routes the communication cable 34 along the arm sections 50 and 52 and around the hinge 56 in a generally parallel configuration relative to the rear of the rack mountable device 12. Accordingly, the cable 34 consumes relatively less space behind the rack mountable device 12 than a generally non-parallel or angled configuration (i.e., curving toward the rack mountable device 12). The cable support arm 24 also may be coupled to the rack mountable device 12 and the rack structure 22 via the device mounting bracket 76 and the rack mounting bracket 70, respectively. As mentioned above, the brackets 70 and 76 may be fixedly or releasably hinged to the arm sections 50 and 52, such that the cable support arm 24 may be adapted to any desired rack system.

In operation, the cable support arm 24 expands and contracts in the rack structure 22 in a V-shaped configuration of the arm sections 50 and 52, which remain stacked one over the other at the hinge 56. As illustrated in FIG. 8, the arm sections 50 and 52 expand inwardly into the rack structure 22 (i.e., in a forward direction) as the rack mountable device 12 is slidingly removed from the rack structure 22. Accordingly, a user can access the rack mountable device 12 while the cables 34 remain connected to the rack system 10.

The illustrated embodiments also facilitates rear access to the rack mountable device 12. As illustrated in FIG. 9, the cable support arm 24 may be rotatable outwardly from the rack structure 22 and the rack mountable device 12, thereby exposing rear controls, receptacles, and components 148 of the rack mountable device 12. For example, the user may align the hinge mechanisms 74 and 80, such that the sections 50 and 52 may be rotatable to a position away from the rear face 44 of the rack structure 22. The user may then access the cables 34, the components 148, and any other previously enclosed features of the rack system 10.

While the subject matter may be susceptible to various modifications and alternative forms, specific embodiments have been shown by way of example in the drawings and will be described in detail herein. However, it should be understood that the subject matter is not intended to be limited to the particular forms disclosed. Rather, the subject matter is to cover all modifications, equivalents and alternatives falling within the spirit and scope of the subject matter as defined by the following appended claims.

What is claimed is:

1. A rack mount system, comprising:
 a rack comprising a rack mounting space; and
 a cable support arm extending pivotally into the rack mounting space, wherein the cable support arm has a swappable mounting bracket exchangeable with a variety of different types and configurations of other mounting brackets, wherein the swappable mounting bracket comprises first and second spaced apart panels having fasteners configured to mate with one another.

2. The rack mount system of claim 1, wherein the swappable mounting bracket is selectable from a plurality of swappable brackets having different mounting structures.

3. The rack mount system of claim 2, wherein the different mounting structures comprise fastener mount and latch mount mechanisms.

4. The rack mount system of claim 1, wherein the swappable mounting bracket comprises a rack mounting mechanism.

5. The rack mount system of claim 1, wherein the swappable mounting bracket comprises a device mounting mechanism.

6. The rack mount system of claim 1, wherein the fasteners comprise an internally threaded fastener and an externally threaded fastener.

7. The rack mount system of claim 1, wherein the cable support arm comprises first and second arm sections rotatably coupled in a stacked configuration at a hinge structure.

8. A cable support arm for a rack mount system, comprising:
   first and second arm sections pivotally coupled at a pivot joint; and
   a rack mounting end structure pivotally coupled to the first arm section at a releasable pivot joint, wherein the rack mounting end structure is interchangeable with at least one different rack mounting end structure, wherein the first and second arm sections are stackable one over the other along a rotational axis of the pivot joint, and the first and second arm sections are configured to rotate between a V-shaped configuration and an X-shaped configuration.

9. The cable support arm of claim 8, wherein the rack mounting end structure comprises a latch insertable into a mounting receptacle in the rack mount structure.

10. The cable support arm of claim 8, wherein the rack mounting end structure comprises a threaded fastener mechanism securable to the rack mount structure.

11. The cable support arm of claim 10, wherein the threaded fastener mechanism comprises mateable fasteners retained in offset mounting panels.

12. The cable support arm of claim 8, wherein the releasable pivot joint comprises a tool-free release mechanism.

13. The method of claim 8, wherein the pivot joint comprises a hinge having the rotational axis.

14. The cable support arm of claim 8, wherein the rack mounting end structure comprises first and second spaced apart panels having fasteners configured to mate with one another.

15. A mounting device for an expandable cable support for a rack system, comprising:
   a swappable cable support mount, comprising:
      a tool-lessly releasable hinge mechanism that is coupleable to the expandable cable support;
      first and second offset panels that are spaced apart and fixed relative to each other and are positionable about opposite sides of a mounting panel of the rack system; and
      first and second mateable fasteners disposed in the respective first and second offset panels, wherein the first fastener is configured to pass through the mounting panel and mate with the second fastener.

16. The mounting device of claim 15, wherein the tool-lessly releasable hinge mechanism comprises a spring-loaded pivot joint.

17. The mounting device of claim 15, wherein the first and second mateable fasteners comprise a rotatably retained threaded fastener.

18. The mounting device of claim 15, wherein at least one of the first and second offset panels comprises a latch structure.

19. The mounting device of claim 15, wherein the first mateable fastener includes external threads and the second mateable fastener includes internal threads.

20. A method of coupling an expandable cable support arm to a rack mount system, comprising:
   removably coupling an interchangeable mounting end of a first arm section of the expandable cable support arm to a rack structure of the rack mount system;
   coupling a second arm section of the expandable cable support arm to a rack mounted device in the rack structure; and
   rotatably moving the first and second arm sections from a V-shaped configuration to an X-shaped configuration.

21. The method of claim 20, wherein rotatably moving the first and second arm sections to the X-shaped configuration comprise rotatably disposing the first and second arm sections one over the other along a rotational axis.

22. The method of claim 20, comprising swapping the interchangeable mounting end with one of a plurality of mounting ends having different mounting mechanisms.

23. A method of movably supporting a cable, comprising:
   providing a movable cable support;
   interchangeably coupling one mounting bracket of a plurality of different rack mounting brackets to an end of the movable cable support at a releasable hinge; and
   mounting the movable cable support to a rack of a rack mount computer system via the one mounting bracket, wherein the movable cable support comprises first and second arm sections configured to rotate between a V-shaped configuration and an X-shaped configuration.

24. The method of claim 23, wherein providing the movable cable support comprises reducing space consumption with first and second support arms disposed in a stacked configuration along a rotational axis.

25. The method of claim 23, wherein interchangeably coupling one mounting bracket comprises tool-lessly uncoupling and recoupling the releasable hinge.

26. The method of claim 23, wherein interchangeably coupling one mounting bracket comprises moving spring-loaded hinge cylinders between operable and inoperable positions.

27. The method of claim 23, wherein mounting comprises tool-lessly latching the one mounting bracket to the rack of the rack mount computer system.

28. The method of claim 23, wherein the one mounting bracket comprises first and second spaced apart panels having fasteners configured to mate with one another.

29. A method of making a cable support for a rack mount system, comprising:
   providing a hinge having a toolfree release mechanism;
   providing a swappable mount having first and second mateable fasteners respectively disposed in two spaced and fixed offset panels, the offset panels being positionable about opposite sides of a mounting panel of the rack mount system; and
   coupling the swappable mount and an expandable cable support to the hinge.

30. The method of claim 29, wherein providing the hinge comprises releasably extending hinge cylinders into hinge receptacles.

31. The method of claim 30, wherein providing the hinge comprises springably biasing the hinge cylinders into the hinge receptacles.

32. The method of claim 29, wherein coupling comprises selecting the swappable mount from a plurality of swappable mounts having different mounting mechanisms.

33. The method of claim 29, comprising forming the first fastener to pass through the two spaced and fixed offset panels and mate with the second fastener.

34. The method of claim 29, comprising uncoupling the swappable mount from the hinge and coupling a different swappable mount to the hinge.

35. The method of claim 29, wherein the first mateable fastener includes external threads and the second mateable fastener includes internal threads.

36. The method of claim 29, wherein the first and second mateable fasteners comprise a latch and latch receptacle.

* * * * *

UNITED STATES PATENT AND TRADEMARK OFFICE
CERTIFICATE OF CORRECTION

PATENT NO.          : 7,317,623 B2                                                Page 1 of 1
APPLICATION NO. : 10/324945
DATED                  : January 8, 2008
INVENTOR(S)        : Minh H. Nguyen et al.

It is certified that error appears in the above-identified patent and that said Letters Patent is hereby corrected as shown below:

On the title page, item (75), under "Inventors", in column 1, line 3, delete "The Woodlands" and insert -- Tomball --, therefor.

Signed and Sealed this

Twenty-eighth Day of October, 2008

JON W. DUDAS
*Director of the United States Patent and Trademark Office*